United States Patent
Pearson et al.

(10) Patent No.: US 7,230,317 B2
(45) Date of Patent: Jun. 12, 2007

(54) CAPACITOR PLACEMENT FOR INTEGRATED CIRCUIT PACKAGES

(75) Inventors: Tom E. Pearson, Beaverton, OR (US); Terry J. Dishongh, Portland, OR (US); David Amir, Portland, OR (US); Damion Searls, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 163 days.

(21) Appl. No.: 10/937,080

(22) Filed: Sep. 8, 2004

(65) Prior Publication Data

US 2006/0049479 A1   Mar. 9, 2006

(51) Int. Cl.
*H01L 29/00* (2006.01)
*H01L 23/02* (2006.01)
*H01L 23/48* (2006.01)
*H01L 23/52* (2006.01)
*H01L 29/40* (2006.01)

(52) U.S. Cl. ............... 257/532; 257/678; 257/724; 257/778

(58) Field of Classification Search ............... 257/532, 257/777–785, 678, 723–724
See application file for complete search history.

(56) References Cited

U.S. PATENT DOCUMENTS

| | | | |
|---|---|---|---|
| 5,303,122 A * | 4/1994 | Adams et al. | 257/778 |
| 6,330,164 B1 * | 12/2001 | Khandros et al. | 257/724 |
| 6,346,743 B1 | 2/2002 | Figueroa et al. | |
| 6,555,920 B2 * | 4/2003 | Chung et al. | 257/779 |
| 6,657,275 B1 | 12/2003 | Chung et al. | |
| 6,706,584 B2 | 3/2004 | List et al. | |
| 6,730,860 B2 | 5/2004 | Searls et al. | |
| 2004/0022038 A1 | 2/2004 | Figueroa et al. | |
| 2004/0056341 A1 * | 3/2004 | Endo et al. | 257/678 |

* cited by examiner

*Primary Examiner*—Cuong Nguyen
(74) *Attorney, Agent, or Firm*—Blakely, Sokoloff, Taylor & Zafman LLP

(57) ABSTRACT

A side-mounted capacitor for a semiconductor die package is described. In one embodiment, a substrate has a die side to which an IC (integrated circuit) may be attached, and an edge adjacent the die side. A bypass capacitor is attached to the package substrate edge.

21 Claims, 3 Drawing Sheets

CAPACITOR PLACEMENT FOR INTEGRATED CIRCUIT PACKAGES

BACKGROUND

1. Field

The present description relates to integrated circuit packaging, and more particularly, to bypass capacitor design and placement on an integrated circuit package.

2. Background

IC's (Integrated Circuits) are manufactured in and on semiconductor wafers with several layers of active circuitry. The wafer is cut into separate semiconductor chips which are mounted to and electrically coupled to package substrates. The package substrates have several layers including a ground plane, and a power plane. The package substrates are sealed inside a package from which pins for the ground plane, power plane and active circuitry extend. These pins allow the package to be coupled to a PCB (Printed Circuit Board).

At higher clock speeds (for example higher than 1 GHz) and faster clock signal rise times (for example less than 100 psec), the power delivery design of integrated circuit packages, results in a very high loop inductance. The loop inductance of the power delivery system may be reduced using bypass capacitors. Bypass (decoupling) capacitors are also used to reduce electrical noise and to suppress unwanted radiation. The electrical noise is generated by capacitive and inductive parasitics and by the continuous switching of the transistors in the circuit.

One type of bypass capacitor is an ECC (Embedded chip capacitor). ECC's are placed on power-consuming circuits and are able to smooth out voltage variations using the stored charge on the decoupling capacitor. The stored charge is used as a local power supply to device inputs during signal switching stages, allowing the decoupling capacitor to mitigate the effects of voltage noise induced into the system by parasitic inductance. However, such decoupling capacitors use space on the chip that might otherwise be used for additional circuitry. In addition, such decoupling capacitors are complex to build within the chip's circuitry. They reduce system yield, and increase production costs. They also suffer from significant voltage leakage increasing heat and power consumption for the chip.

Bypass capacitors may also be placed on both the bottom side of the exterior of an integrated circuit package directly underneath the die (land side capacitor) and on the top side of the exterior of the package (die side capacitor). With land side capacitors, the capacitors' terminals are connected to IC loads through the package substrate. Electrically conductive vias and patterned planes within the package substrate allow the capacitors to provide bypassing capacitance to the IC.

Connection of the capacitors to the load through the vias and planes results in some "vertical" inductance, also referred to as "loop" inductance, in the supply and return via loop between each capacitor and the integrated circuit load. Land side capacitors in a typical package are located on the same side of the package as the power and data connection pins or pads for the package. As a result, the capacitors can interfere with the pins or pads on the bottom side of surface mounted components.

Die side capacitors, mounted on the opposite side from the connection pins and pads do not interfere with mounting the package. However, die side capacitors have still higher inductance characteristics. In addition, since die side capacitors attach to the metal layers of the IC, the total number of capacitors is limited by the amount of metal available on the surface of the die.

Both land side and die side capacitors require surface area on the package that then cannot be used for any other purpose. As IC's become smaller, less surface area is available for mounting capacitors. Even as packages grow smaller some space is still required for handling the package and for pressing it into sockets for burn-in, test, and installation. Handling and pressing a package risks damaging or dislodging any nearby capacitors.

BRIEF DESCRIPTION OF THE DRAWINGS

Embodiments of the present invention will be understood more fully from the detailed description given below and from the accompanying drawings of various embodiments of the invention. The drawings, however, should not be taken to be limiting, but are for explanation and understanding only.

DETAILED DESCRIPTION

In one embodiment, decoupling capacitors are coupled to an edge or side of an IC (Integrated Circuit) package. If the power and ground planes extend to the edges of the package, then the decoupling capacitors may be connected directly to the ground and power planes of the chip. This eliminates any loop inductance. Alternatively, the capacitor may be connected using vias.

Figure 1:
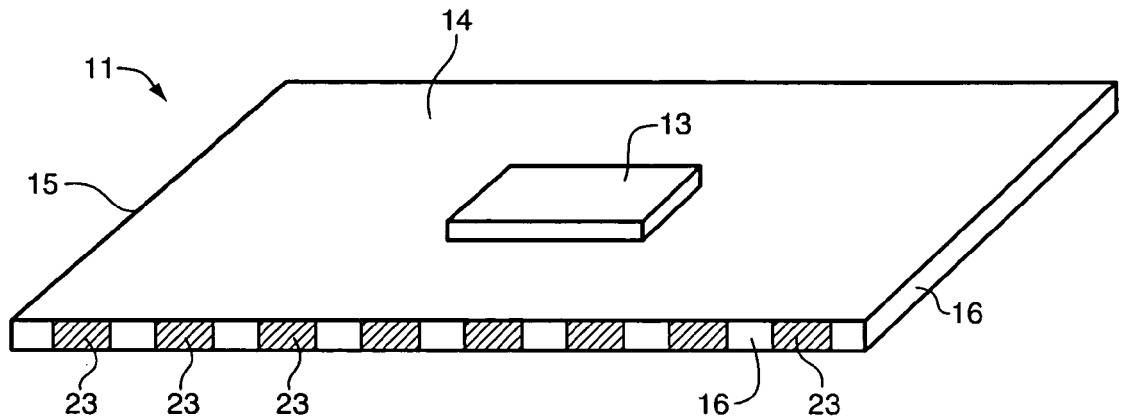
FIG. 1 is a diagram of an IC package in perspective view with attached edge capacitors according to an embodiment of the invention.

FIG. 1 is a diagram of a portion of an IC package 11 in perspective view. The package has an IC, die or chip 13 attached to a package substrate 15. The package may also include a cover or integrated heat spreader (not shown) attached and sealed to the package substrate to cover and protect the die. The die may be any of a variety of different types including a microprocessor, microcontroller, ASIC (Application Specific Integrated Circuit), FPGA (Field Programmable Gate Array), DSP (Digital Signal Processor), memory, memory controller hub (MCH), I/O (Input/Output) controller hub (ICH), graphics controller etc.

The package substrate may be formed from any rigid dielectric substrate, such as a standard PC (printed circuit) board material, for example, FR-4 epoxy-glass, polyimide-glass, benzocyclobutene, Teflon, other epoxy resins, injection molded plastic or the like or ceramic. In one embodiment, the substrate is about 40 mils (1.0 mm) thick although it may be thicker or thinner, in other embodiments. The substrate has data, control, and power interfaces (not shown) to the chip. The package and package substrate have a die side 14 to which the die is attached and a land side on the opposite side of the substrate (not shown). Between the die side and the land side is an edge 16 around the periphery of the substrate. While the die side of the substrate will be partially or completely covered by the package cover, the land side and the edge of the substrate remain exposed. As shown in FIG. 1, capacitors 23 are attached along this edge.

Figure 2A:
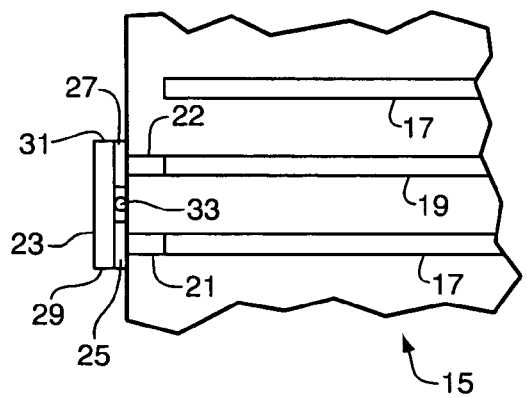
FIG. 2A is a is a cross-sectional side view of a package substrate showing ground and power planes with an attached capacitor according to an embodiment of the invention.
Figure 2B:
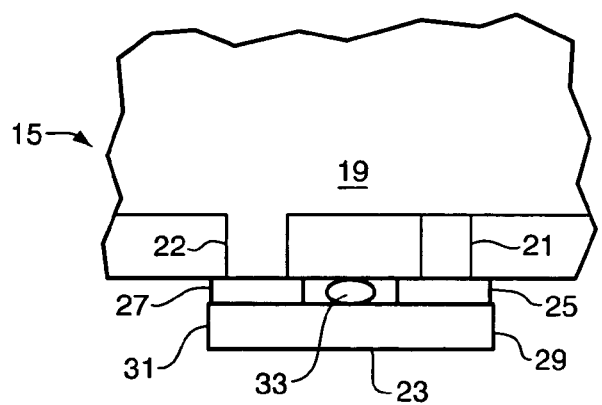
FIG. 2B is a is a cross-sectional top view of a package substrate showing ground and power planes with an attached capacitor according to an embodiment of the invention.

For carrying power to the IC, the substrate has ground 17 and power 19 planes as shown in FIGS. 2A and 2B. FIG. 2A shows the package substrate 15 in a partial side cross-sectional view. The ground and power planes are shown as parallel and coextensive in FIG. 2, however, they may be designed in different configurations to suit a particular application. The ground 17 and power 19 planes may be made of any conductive material, including copper, aluminum, tin, lead, nickel, gold, palladium, and carbon or other materials and may be insulated on either side by dielectric layers made, for example, of the PC board or ceramic materials mentioned above. The ground and power planes both have a tab 25, 27 that extends to a common edge of the substrate.

Pads 25, 27 are soldered to the tabs to provide a connection to the tabs. The decoupling capacitors 23 are attached to the pads to couple the ground and power planes through the capacitor. Each capacitor has two electrodes, one for each plate. One electrode 29 is coupled to the ground plane and the other electrode 31 is coupled to the power plane. In one embodiment glue dots 33 are applied to the substrate edge. The capacitors 23 are attached to the substrate edge using the glue and then solder reflow is used to solder the electrodes 29, 31 to the pads 25, 27.

FIG. 2B shows the package substrate in a partial cross-sectional top view. The power plane 19 has a tab 22 that extends to the edge of the substrate 15. The ground plane 17 is underneath the power plane and cannot be seen in this top view but the ground plane tab 21 is visible. Both tabs connect to their respective pads 25, 27 and the pads are connected to a capacitor 23 at its two electrodes, respectively.

In another embodiment, copper filled closed vias may be placed on the edge of the package substrate and during de-panel, the vias may be cut in half. One side of the via may then be coupled to the ground plane and the other side of the via may be coupled to the power plane. The decoupling capacitors may be placed across the bisected vias.

Any of a variety of different capacitors and capacitor types may be used. In one embodiment, the capacitors have a high grade ceramic body of aluminum oxide with metal electrodes at each end connected by a resistive paste. The end electrodes may be covered in tin or a lead/tin alloy to aid in soldering the capacitors to the pads. The capacitors are designed with the appropriate characteristics required for the particular IC. In one embodiment, the package substrate is 43 mils (1.1 mm) thick and the capacitor is a 0402 form factor capacitor with dimensions of 40 mils (1.0 mm) by 24 mils (0.6 mm). In another embodiment, the package substrate is 39 mils (1.0 mm) thick and the capacitor is a 0201 form factor capacitor having dimensions of 24 mils (0.6 mm) by 12 (0.3 mm) mils. The capacitance, resistance and inductance of the capacitors may be selected based on the characteristics of the ground and power planes as well as the die.

In various embodiments, the capacitors may be ceramic capacitors, aluminum oxide capacitors, organic capacitors or capacitors made with many other technologies. The capacitors may have from two to many external terminals distributed on two or four sides. In addition, the actual and relative dimensions of the packages, integrated circuits, and discrete capacitors may vary widely, depending on design and manufacturing constraints or other factors.

As shown in FIG. 1, each edge of the substrate may carry several capacitors. FIG. 1 shows eight capacitors along a substrate edge. The appropriate number of capacitors will depend on the size of the package substrate, the number of edges to be used and the desired decoupling capacitance. The diagram of FIG. 2 is not to scale as a typical package substrate may be about 1380 mils (35 mm) on its longest side. Such a substrate may accommodate over 15 0402 sized capacitors. In one embodiment, two opposite edges of the package substrate carry capacitors and the other two edges are used for handling and carrying the package during burn-in and test.

Figure 3:
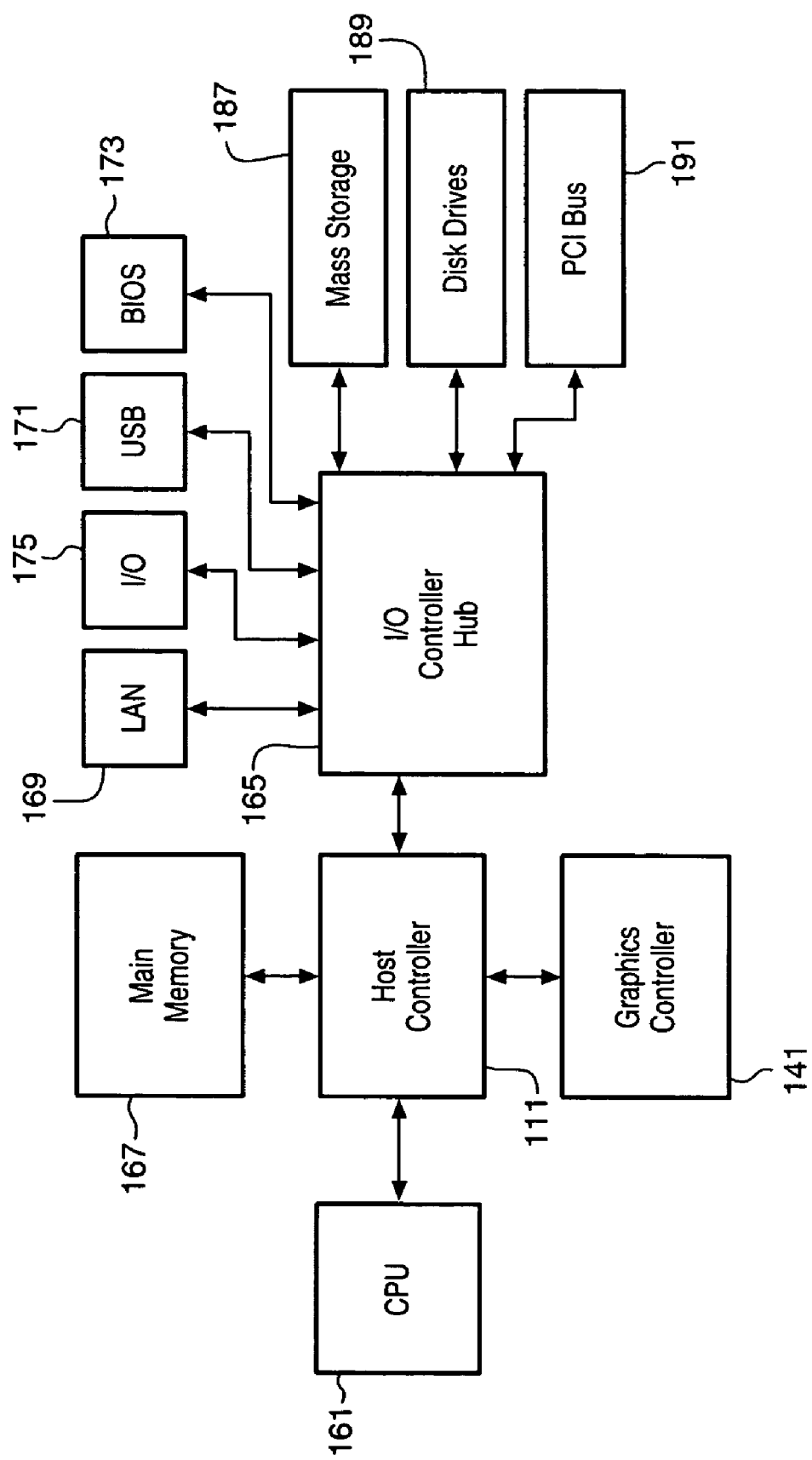
FIG. 3 is a block diagram of a computer system suitable for use with embodiments of the invention.

FIG. 3 shows an example of a computer system containing several different IC components to which embodiments of the present invention may be applied. Embodiments of the present invention may be adapted for application on a great number of different ICs, including microprocessor packages and chipsets. In this example, the computer system may include a packaged CPU (Central Processing Unit) 161 coupled to a chipset component 111 such as a Memory Controller Hub (MCH) chip. The MCH chip functions as part of a supporting chipset for the CPU. The MCH chip is coupled to a main memory 167, such as DRAM and to a graphics controller 141.

The MCH chip 111 is also coupled to an ICH (Input/Output controller hub) chip 165. The ICH chip offers connectivity to a wide range of different devices. Well-established conventions and protocols may be used for these connections. The connections may include a LAN (Local Area Network) port 169, a USB hub 171, and a local BIOS (Basic Input/Output System) flash memory 173. A SIO (Super Input/Output) port 175 may provide connectivity for a keyboard, a mouse, and any other human interface devices.

The ICH may also provide an IDE (Integrated Device Electronics) bus for connections to disk drives 187, 189 or other large memory devices. The mass storage may include hard disk drives and optical drives. A PCI (Peripheral Component Interconnect) or PCI-X (PCI-Express) bus 191 may be coupled to the ICH to allow a wide range of devices and ports to be coupled to the ICH. The architecture of FIG. 3 allows for a wide range of different functions and capabilities. The specific details of any implementation will depend on the particular application.

The CPU, MCH, ICH, LAN port USB hub, BIOS, SIO port, IDE and PCI buses may all be carried on a single motherboard of the computer system. Any one or more peripheral devices may also be carried on the motherboard. The computer system may be adapted for use in many different applications including office productivity, communications, entertainment, music and video production or manufacturing. In the hardware of FIG. 3, side mounted capacitors may be used to advantage on at least the CPU, MCH, ICH, Graphics controller, and flash memory BIOS chips.

Figure 4:
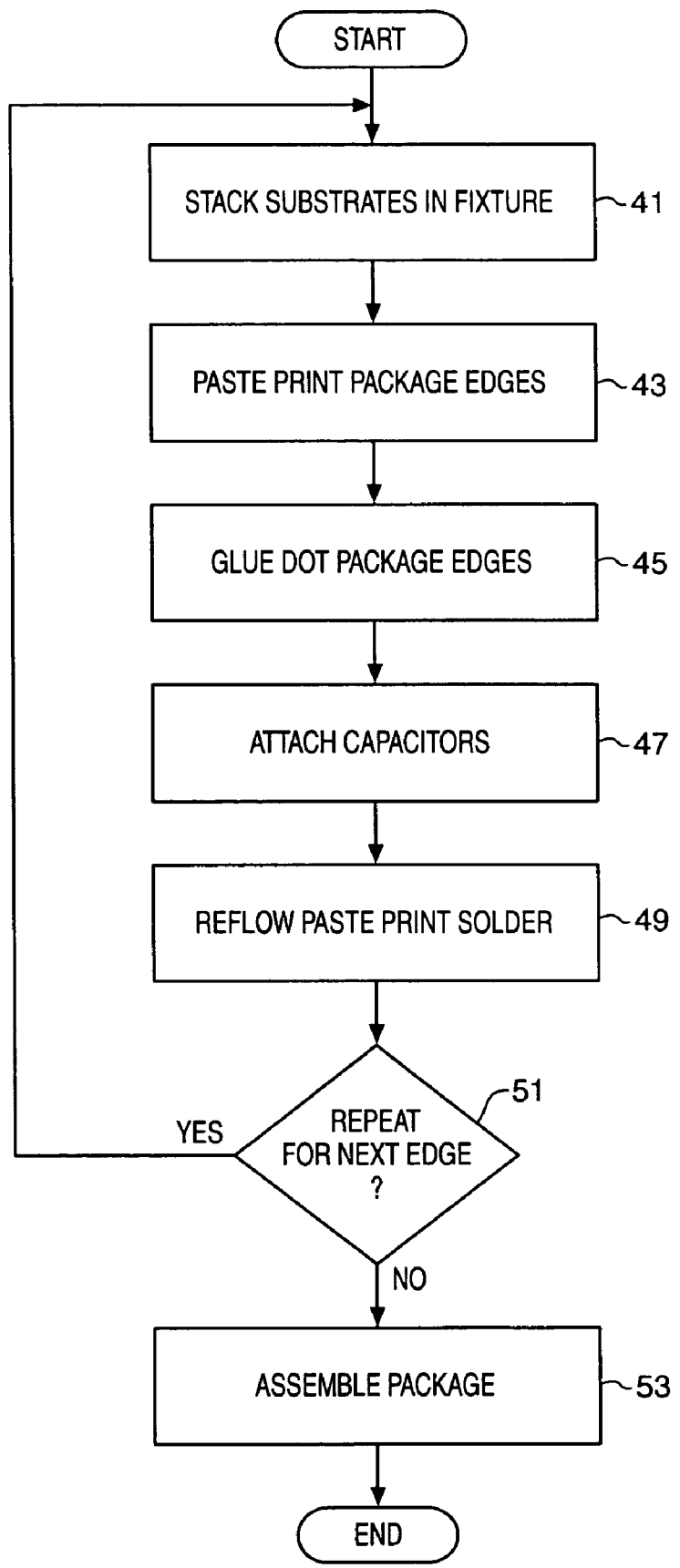
FIG. 4 shows a process for attaching capacitors to a package substrate according to an embodiment of the invention.

FIG. 4 shows an example of a process for attaching the capacitors to the package substrate. At block 41, a group of package substrates are stacked vertically in a fixture so that the edges of the packages are exposed. This may be done before the ball attach process which attaches solder ball connection points to the IC connection points or any other connector attachment. At block 43, the edges of the packages that are to carry capacitors are paste printed with solder. This solder will be used to attach the capacitors. At block 45, dots of glue are placed on the edge of the substrate in the center of the footprint for each capacitor that will be attached.

At block 47, the capacitors are attached to the substrate edges using the glue dots. The capacitors may be attached using a tape reel that carries the capacitors and an appropriate tape reel dispenser. At block 49, the paste printed solder is reflowed to electrically couple the chip capacitors to the package edge. This attachment process may be repeated, at block 51, for any of the other package edges or all of the edges may be handled in one process. After attachment of the edge decoupling capacitors, the rest of the package may be assembled, at block 53, as appropriate for the intended application.

Although the description of the various embodiments refers primarily to using discrete capacitors in conjunction with an integrated circuit package, the various embodiments may also be used with other types of packages, interposers, PC boards or other electronic circuit housings. The various embodiments may be used with various types of electronic assemblies, and are not to be limited to use with integrated circuit packages.

In addition, the various embodiments may be used with a number of different types of packages and packaging technologies, for example, organic or ceramic packages, and technologies such as land grid array (e.g., organic LGA), pin grid array (e.g., plastic PGA or flip chip PGA), ball grid array (e.g., µBGA, plastic BGA, flip chip BGA or flip chip tape BGA), and beam lead.

Packages using side or edge mounted capacitors as described herein may also use other decoupling capacitors in addition to any edge-mounted capacitors. Such other capacitors include die side, land side and embedded chip capacitors.

It is to be appreciated that a lesser or more complex semiconductor device, integrated circuit, package or capacitor than the examples described above may be preferred for certain implementations. Therefore, the configurations may vary from implementation to implementation depending upon numerous factors, such as price constraints, performance requirements, technological improvements, or other circumstances. Embodiments of the invention may also be applied to other types of systems that use different devices than those shown in the Figures.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several embodiments, those skilled in the art will recognize that the invention is not limited to the embodiments described, but may be practiced with modification and alteration within the spirit and scope of the appended claims. The description is thus to be regarded as illustrative instead of limiting.

What is claimed is:

1. An apparatus comprising:
   a substrate having a die side to which an IC (integrated circuit) may be attached, and an edge adjacent the die side, the substrate further having a ground plane within the substrate having an edge aligned with the substrate edge, and a power plane within the substrate, isolated from the ground plane, and having an edge aligned with the substrate edge; and
   a bypass capacitor attached to the package substrate edge, the capacitor having an electrode coupled to the ground plane edge and an electrode coupled to the power plane edge.

2. The apparatus of claim 1, wherein the substrate ground plane and power plane are part of a power delivery system and wherein the capacitor is attached to the power delivery system to reduce inductance of the power delivery system.

3. The apparatus of claim 1, further comprising a first via between the ground plane and the first electrode and a second via between the power plane and the second electrode to electrically connect the planes with the electrodes.

4. The apparatus of claim 1, wherein the ground plane has a tab proximate the substrate edge and the power plane has a tab proximate the substrate edge, the apparatus further comprising a pad coupled to the ground plane tab and a pad coupled to the power plane tab and wherein the capacitor is coupled to the tabs.

5. The apparatus of claim 4, further comprising a glue dot between the pads to hold the capacitor against the substrate edge until the capacitor is coupled to the pads.

6. The apparatus of claim 1, wherein the substrate and the capacitor are installed into a package.

7. The apparatus of claim 1, further comprising a cover fastened to the die side of the substrate to protect the die.

8. The apparatus of claim 3, wherein the vias comprise copper-filled vias from the ground plane and the power plane, respectively to the substrate edge.

9. The apparatus of claim 5, wherein the, glue dot is in the center of the footprint of the capacitor.

10. The apparatus of claim 5, wherein the capacitor is attached to the substrate edge using a capacitor tape reel and tape reel dispenser.

11. The apparatus of claim 1, wherein the capacitor electrodes are electrically coupled to the ground plane and the power plane, respectively, using paste printed solder that is subsequently reflowed.

12. The apparatus of claim 1, wherein the ground plane is parallel to and coextensive with the power plane.

13. An apparatus comprising:
    a semiconductor die;
    a substrate having a die side to which the semiconductor die is attached and an edge adjacent the die side, the substrate further having a ground plane within the substrate having an edge aligned with the substrate edge and a power plane within the substrate having an edge aligned with the substrate edge to deliver power to the die; and
    a bypass capacitor attached to the package substrate edge to reduce inductance between the ground plane and the power plane, the capacitor having an electrode coupled to the ground plane edge and an electrode coupled to the power plane edge.

14. The apparatus of claim 13, further comprising a cover fastened to the die side of the substrate to protect the die.

15. The apparatus of claim 13, further comprising a pad coupled to the ground plane and a pad coupled to the power plane and wherein the capacitor electrodes are coupled to each pad.

16. The apparatus of claim 15, further comprising a glue dot between the pads to hold the capacitor against the substrate edge until the capacitor is coupled to the pads.

17. The apparatus of claim 13, wherein the semiconductor die comprises a memory controller chip, the apparatus further comprising:
    a motherboard:

a CPU (central processing unit) coupled to the motherboard; and a memory coupled to the motherboard, the memory controller chip being coupled between the CPU and the memory through the substrate, the substrate being between the memory controller chip and the motherboard.

18. The apparatus of claim 13, wherein the substrate and the capacitor are installed into a package.

19. The apparatus of claim 13, further comprising a first copper-filled via between the ground plane and the first electrode and a second copper-filled via between the power plane and the second electrode to electrically connect the planes with the electrodes.

20. The apparatus of claim 16, wherein the glue dot is in the center of the footprint of the capacitor.

21. The apparatus of claim 13, wherein the capacitor electrodes are electrically coupled to the ground plane and the power plane, respectively, using paste printed solder that is subsequently reflowed.

* * * * *